US006969991B2

(12) United States Patent
Bammer et al.

(10) Patent No.: US 6,969,991 B2
(45) Date of Patent: Nov. 29, 2005

(54) CORRECTION OF THE EFFECT OF SPATIAL GRADIENT FIELD DISTORTIONS IN DIFFUSION-WEIGHTED IMAGING

(75) Inventors: Roland Bammer, Palo Alto, CA (US); Michael Markl, Palo Alto, CA (US); Burak Acar, Palo Alto, CA (US); Norbert J. Pelc, Los Altos, CA (US); Michael E. Moseley, Redwood City, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 335 days.

(21) Appl. No.: 10/317,516

(22) Filed: Dec. 11, 2002

(65) Prior Publication Data

US 2004/0113615 A1 Jun. 17, 2004

(51) Int. Cl.[7] ................................................ G01V 3/00
(52) U.S. Cl. ...................................... 324/307; 324/309
(58) Field of Search ................................ 324/307, 309, 324/312, 314, 318, 322, 300

(56) References Cited

U.S. PATENT DOCUMENTS

| | | | | |
|---|---|---|---|---|
| 4,591,789 A | * | 5/1986 | Glover et al. | ................ 324/307 |
| 5,539,310 A | | 7/1996 | Basser et al. | |
| 6,163,152 A | | 12/2000 | Bernstein et al. | |
| 6,445,182 B1 | * | 9/2002 | Dean et al. | .................. 324/309 |
| 6,463,315 B1 | | 10/2002 | Klingberg et al. | |
| 6,788,062 B2 | * | 9/2004 | Schweikard et al. | ........ 324/321 |

OTHER PUBLICATIONS

Bammer et al., "Assessment of Spatial Gradient Field Distortion in Duffusion Weighted Imaging," ISMRM Abstract, Dec. 12, 2001.
Bammer et al., "Assessment and Correction of Spatial Gradient Field Distortions in Diffusion–Weighted Imaging," ISMRM poster, May 10, 2002.

* cited by examiner

Primary Examiner—Louis Arana
(74) Attorney, Agent, or Firm—Beyer Weaver & Thomas LLP

(57) ABSTRACT

A general mathematical framework is formulated to characterize the contribution of gradient non-uniformities to diffusion tensor imaging in MRI. Based on a model expansion, the actual gradient field is approximated and employed, after elimination of geometric distortions, for predicting and correcting the errors in diffusion encoding. Prior to corrections, experiments clearly reveal marked deviations of the calculated diffusivity for fields of view generally used in diffusion experiments. These deviations are most significant with greater distance from the magnet's isocenter. For a FOV of 25 cm the resultant errors in absolute diffusivity can range from approximately −10 to +20 percent. Within the same field of view, the diffusion-encoding direction and the orientation of the calculated eigenvectors can be significantly altered if the perturbations by the gradient non-uniformities are not considered. With the proposed correction scheme most of the errors introduced by gradient non-uniformities can be removed.

5 Claims, 8 Drawing Sheets

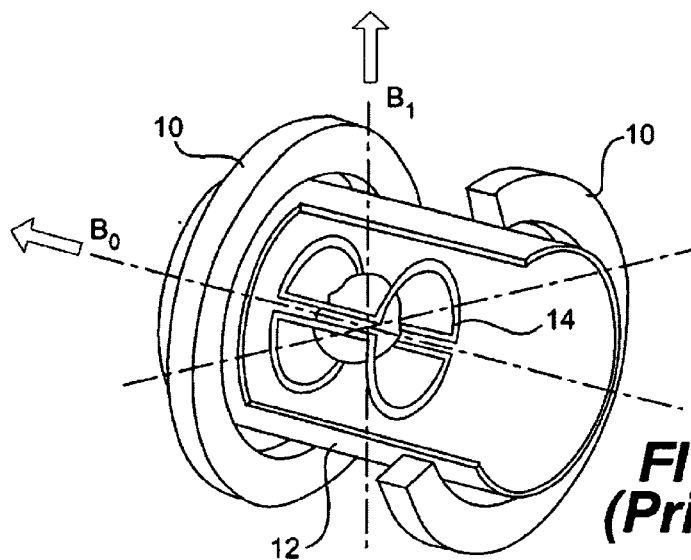
FIG. 6A
*(Prior Art)*
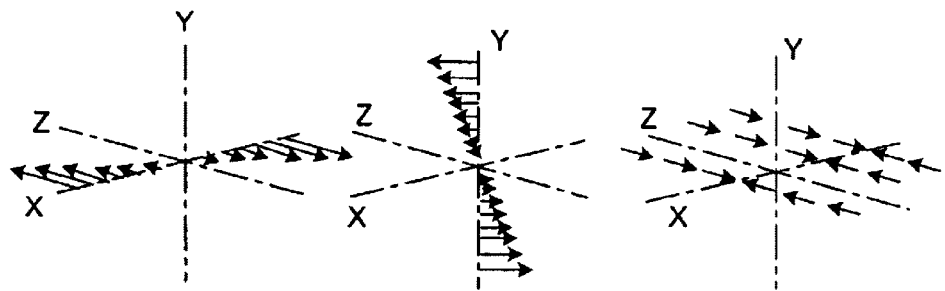
FIG. 6B
*(Prior Art)*
FIG. 6C
*(Prior Art)*
FIG. 6D
*(Prior Art)*
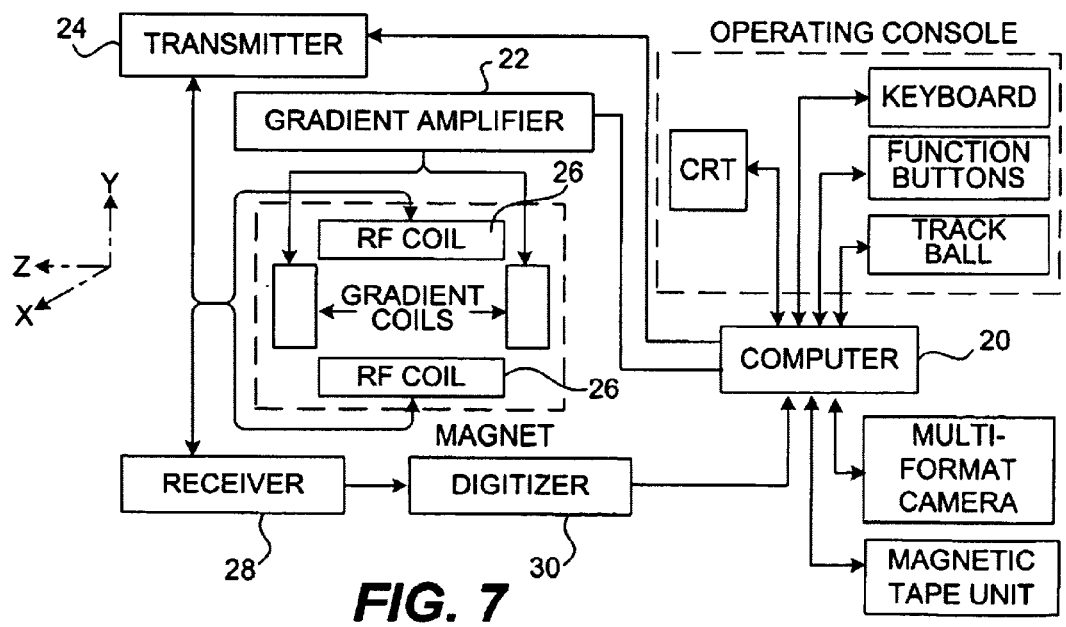
FIG. 7
*(Prior Art)*

CORRECTION OF THE EFFECT OF SPATIAL GRADIENT FIELD DISTORTIONS IN DIFFUSION-WEIGHTED IMAGING

STATEMENT AS TO RIGHTS TO INVENTIONS MADE UNDER FEDERALLY SPONSORED RESEARCH OR DEVELOPMENT

The U.S. Government has rights in the disclosed invention pursuant to NIH grants No. P41 RR 09784 and No. IR01 NS 35959 to Stanford University.

BACKGROUND OF THE INVENTION

This invention relates generally to magnetic resonance imaging (MRI), and more particularly, the invention relates to characterizing and correcting spatial gradient non-uniformities in diffusion tensor imaging.

Magnetic resonance imaging (MRI) requires placing an object to be imaged in a static magnetic field, exciting nuclear spins in the object within the magnetic field, and then detecting signals emitted by the excited spins as they precess within the magnetic field. Through the use of magnetic gradient and phase encoding of the excited magnetization, detected signals can be spatially localized in three dimensions.

FIG. 6A is a perspective view partially in section illustrating conventional coil apparatus in an NMR imaging system, and FIGS. 6B–6D illustrate field gradients which can be produced in the apparatus of FIG. 6A. This apparatus is discussed by Hinshaw and Lent "An Introduction to NMR Imaging: From the Bloch Equation to the Imaging Equation" *Proceedings of the IEEE*, Vol. 71, No. 3, March 1983, pp. 338–350. Briefly, the uniform static field $B_0$ is generated by the magnet comprising the coil pair 10. A gradient field $G(r)$, with $r=[x\ y\ z]^T$, is generated by a complex gradient coil set which can be wound on the cylinder 12. An RF field $B_1$ is generated by a saddle coil 14. A patient undergoing imaging would be positioned within the saddle coil 14.

In FIG. 6B an X gradient field is shown which is parallel to the static field $B_0$ and ideally varies linearly with distance along the X axis but ideally does not vary with distance along the Y or Z axes. FIGS. 6C and 6D are similar representation of the Y gradient and Z gradient fields, respectively.

FIG. 7 is a functional block diagram of conventional imaging apparatus as disclosed in NMR-A Perspective in Imaging, General Electric company. A computer 20 is programmed to control the operation of the NMR apparatus and process FID signals detected therefrom. The gradient field is energized by a gradient amplifier 22, and the RF coils 26 for impressing an RF magnetic moment at the Larmor frequency are controlled by the transmitter 24. After the selected nuclei have been flipped, the RF coil 26 is employed to detect the FID signal which is passed to the receiver 28 and thence through digitizer 30 for processing by computer 20.

The use of diffusion tensor magnetic resonance imaging (DTI) for imaging anistropic tissue such as brain white matter is known. See U.S. Pat. No. 6,463,315 for analysis of Cerebral White Matter for Prognosis and Diagnosis of Neurological Disorders as well as U.S. Pat. No. 5,539,310 for Method and system for measuring the diffusion tensor and for diffusion tensor imaging and art cited therein. DTI provides a novel way to characterize tissues based on sensitivity to microscopic molecular motion of water. Clinical implementation requires strong, fast hardware and careful post processing of diffusion parameters. Diffusion weighted images and derivatives such as the three principal diffusivities of the diffusion tensor are quite specific in reflecting the physical properties of diffusion.

Diffusion weighted imaging (DWI), in general, consists of estimating the effective scalar diffusivity of water, D, in each voxel from a set of diffusion weighted images. During the time of a typical magnetic resonance data acquisition, water molecules diffuse on the order of a few microns, which is comparable to the dimensions of cellular structures, but significantly less than the dimensions of a voxel. Since D is sensitive to the physical properties, composition and spatial distribution of the tissue constituents, the measurement is sensitive to the tissue microstructure and physiological state.

Diffusion along a given axis is typically measured by placing a pair of diffusion sensitizing gradient pulses in the same axis in the magnetic resonance (MR) pulse sequence. The gradient pulses impose position-dependent phases on water protons that are equal in magnitude but opposite in sign and therefore cancel for stationary spins. However, for protons that move between the two gradient pulses, a finite net phase is accumulated. The sum of all phases from all protons results in attenuation of the MR signal due to interference effects. The magnitude of signal attenuation is dependent on the diffusivity of water, and the width, separation and amplitude of the gradient pulses. In a generalized case where the diffusivity may differ in different directions, a diffusion tensor matrix notation is used.

Non-uniformities of magnetic field gradients can cause serious artifacts in diffusion tensor imaging. While it is well appreciated that non-linearities of the imaging gradients lead to image warping (see for example Bernstein et al., U.S. Pat. No. 6,163,152), those imperfections can also cause spatially dependent errors in the direction and magnitude of the diffusion encoding.

BRIEF SUMMARY OF THE INVENTION

In accordance with the invention, a general mathematical framework has been formulated to characterize the contribution of gradient non-uniformities to diffusion tensor imaging. Based on a spherical harmonics expansion, the actual gradient field is approximated and employed, after elimination of geometric distortions, for predicting and correcting the errors in diffusion encoding.

Prior to corrections, experiments clearly reveal marked deviations of the calculated diffusivity for fields of view generally used in diffusion experiments. These deviations are most significant with greater distance from the magnet's isocenter. For a FOV of 25 cm the resultant errors in absolute diffusivity can range from approximately −10 to +20 percent. Within the same field of view, the diffusion-encoding direction and the orientation of the calculated eigenvectors can be significantly altered if the perturbations by the gradient non-uniformities are not considered. With the proposed correction scheme most of the errors introduced by gradient non-uniformities can be removed.

The invention and objects and features thereof will be more readily apparent from the following description and appended claims when taken with the drawings.

BRIEF DESCRIPTION OF THE DRAWINGS

FIG. 6A is perspective view partially in section illustrating conventional coil apparatus in an NMR imaging system, and FIGS. 6B–6D illustrate field gradients which can be produced in the apparatus of FIG. 6A, and FIG. 7 is a functional block diagram of conventional imaging apparatus.

DETAILED DESCRIPTION OF THE INVENTION

The new generation of high performance gradient systems utilizes gradient coil designs with modest field of view in order to limit dB/dt, which can cause nerve stimulation. As a result, magnetic field gradients can exhibit significant non-linearities. Such non-linearities are well known to cause spatial image warping in MR images, and methods are routinely used to retrospectively correct geometric distortions. Although image warping errors are well recognized, little has been reported about the influence of gradient distortion on diffusion-weighted imaging (DWI) or other quantitative techniques. The fact that spatially non-linear diffusion gradients can affect DWI has been mentioned briefly by LeBihan, Diffusion and Perfusion Magnetic Resonance Imaging, Raven Press, New York, 1995 and others including Bernstein et al., U.S. Pat. No. 6,163,152, supra, in which a relative gross correction was proposed that also only works for scalar measurements, but overall this effect seems to be generally neglected and, as we will show, vastly underestimated.

Figure 1A:
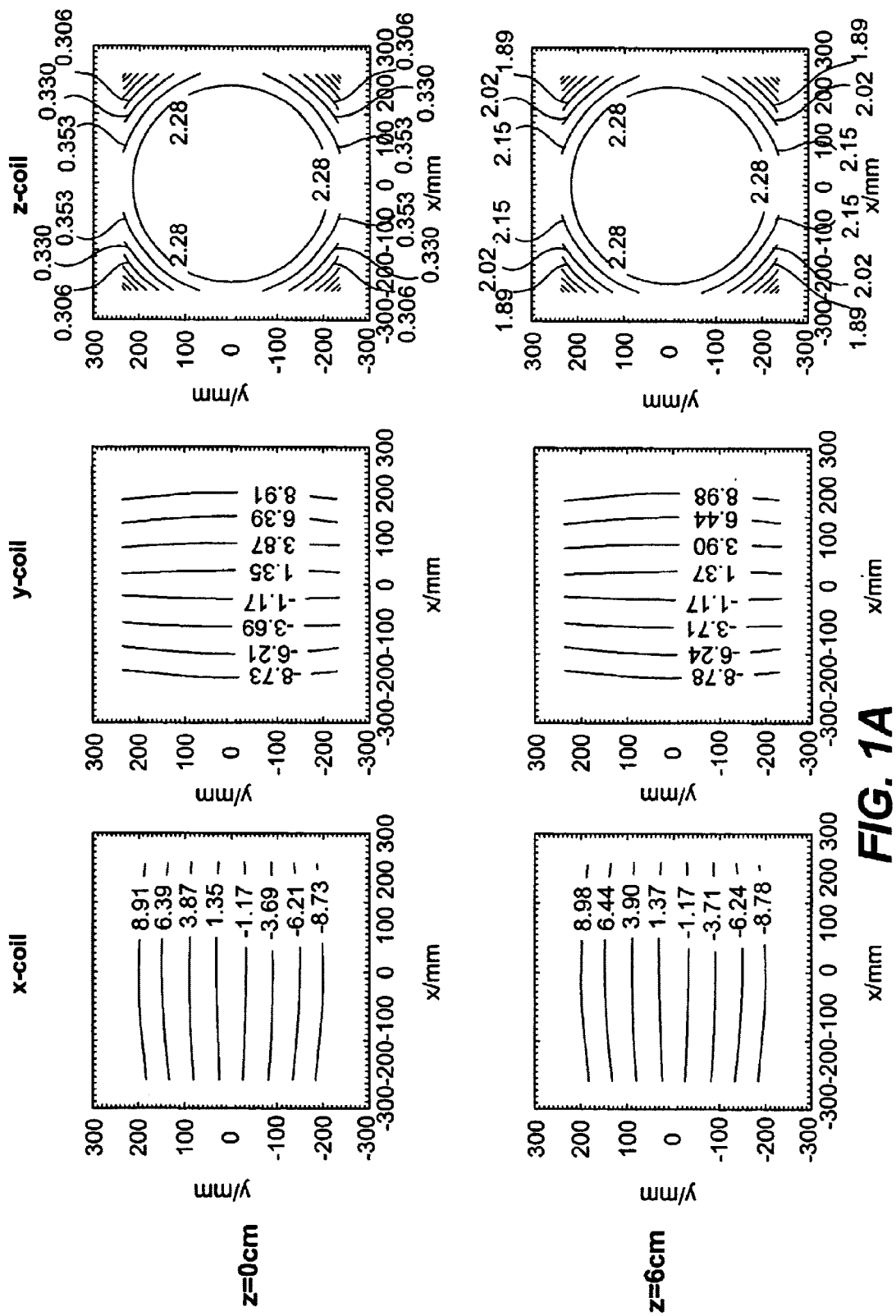
FIGS. 1a and 1b are an axial view and a coronal view, respectively, of isocontour plots of the magnetic field $B_z(r)$ produced by x, y, and z gradient coils and z=0 cm and at z=6 cm demonstrating unequal spaced and curved isocontours
Figure 1B:
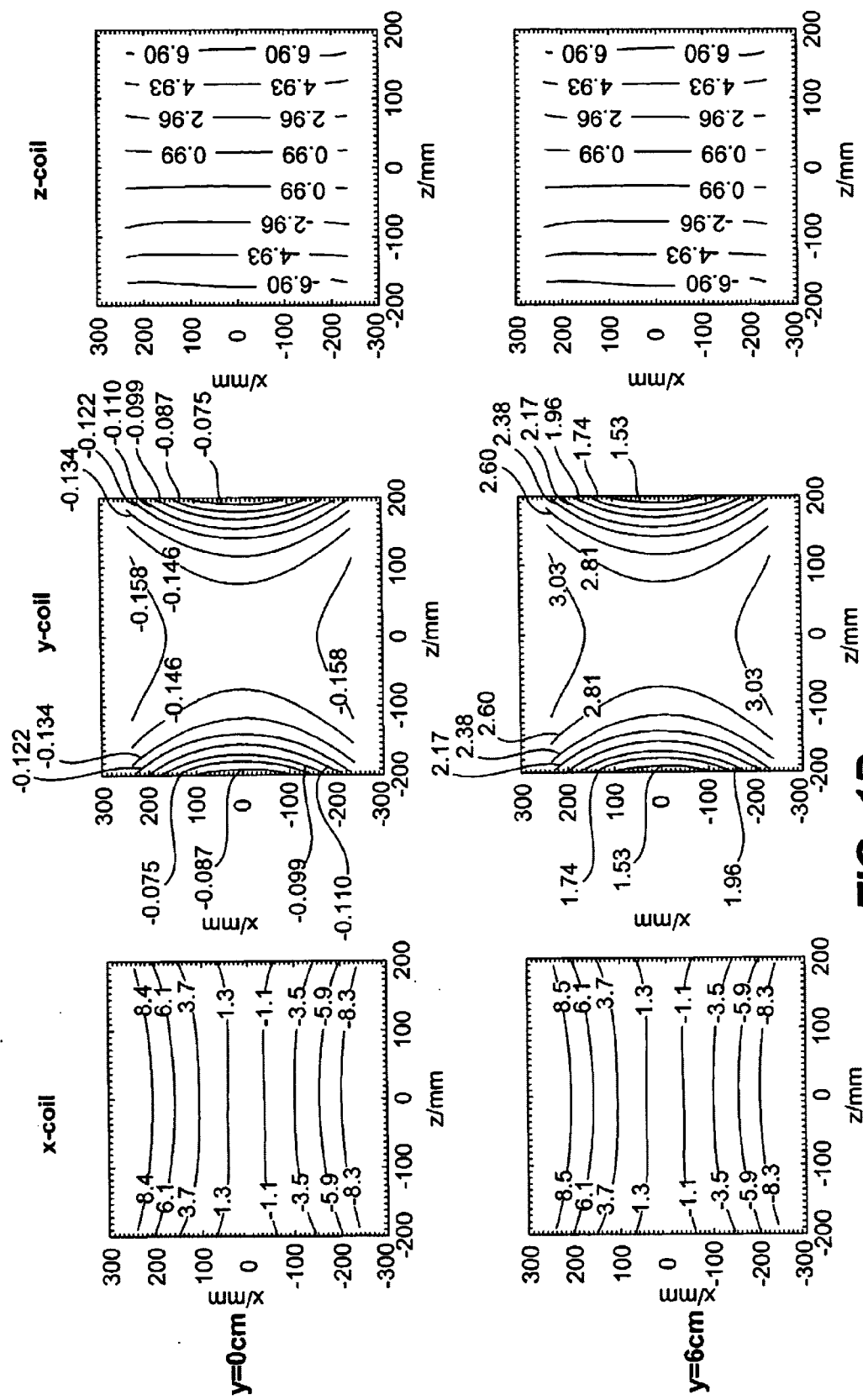

Gradient non-uniformities on a clinical whole-body unit can be significant for fields of view commonly used in cranial diffusion experiments (FIG. 1). This is unfortunate since non-linearities ultimately cause the accuracy of absolute diffusion information to vary spatially. Since the deviations from the desired gradients enter the diffusion attenuation factor quadratically, errors can be even larger than in other MR techniques such as quantitative flow measurements. Such deviations can cause errors much larger than those from background gradients. At their maximum, these errors can even exceed perturbations from cross-terms caused by badly placed imaging gradients in the DWI sequence. Additionally, it can be shown that spatial deviations from the desired gradients can significantly perturb the interpretation of diffusion tensor information or high angular resolution diffusion measurements. Moreover, the problem of spatially varying gradients might impair attempts to spatially normalize diffusion studies with the objective to investigate group effects or for repetitive measurements to monitor subtle pathological changes, such as in multiple sclerosis.

By virtue of the knowledge of the mismatch between the desired and the actual gradient field, an adapted calculation of the diffusion information allows a straightforward correction. After laying out the theoretical framework, this study demonstrates the capability of retrospective correction of both geometric distortions and quantitative diffusion measurements and shows the efficacy in practical examples.

By looking at the magnetic field isocontours in FIG. 1, it can be seen that—due to Laplace's equation—a single gradient coil which is energized to produce a magnetic field gradient along one dimension also generates field changes along the orthogonal dimensions. In other words, the desired gradient is not only of wrong strength but also its orientation deviates from the originally intended one.

If the relative deviations from the desired field are known, a spatially varying perturbation tensor L(r) can be used to relate the effective local field gradient to the desired gradient. The elements of the perturbation tensor contain the spatially varying error terms for each of the principal gradient axes, where the actual gradient, $G_{act}$, and the desired gradient, G, are related to each other by:

$$G_{act}(r) = \begin{pmatrix} \lambda_{xx}(r) & \lambda_{xy}(r) & \lambda_{xz}(r) \\ \lambda_{yx}(r) & \lambda_{yy}(r) & \lambda_{yz}(r) \\ \lambda_{zx}(r) & \lambda_{xy}(r) & \lambda_{zz}(r) \end{pmatrix} G = L(r) G \quad (1)$$

In Equation 1, the first index of the $\lambda_{ij}$ (i,j=x,y,z) represents the acceptor, the second index the donator gradient axis. The $\lambda_{ij}$-factors can be calculated from the partial derivatives of the effective spatially dependent field normalized by the applied nominal gradient strength $G_i$ $$\lambda_{ji} = \left(\frac{\partial B_z^i(r)}{\partial j}\right) / G_i \quad \text{with } ij = x, y, \text{ and } z. \quad (2)$$

Here, the spatial dependence of the field $B_z^i$ (r) generated by each gradient coil (i=x, y, or z coil) is generally expressed as a spatial harmonic expansion $$B_z^{i=x,y,z}(r) = \sum_{k=0}^{\infty} \sum_{l=0}^{k} \alpha_{kl}^i H_{kl}^C(r) + \beta_{kl}^i H_{kl}^S(r) = Gr + E(r), \quad (3)$$

where $H_{kl}^C$ (r) and $H_{kl}^S$ (r) are the solid spherical harmonic basis functions and $\alpha_{kl}^i$ and $\beta_{kl}^i$ are the corresponding coefficients that are specific to the MRI system. The model in Equation 3 clearly indicates that the effective spatially varying field comprises the contribution from the desired linear field gradient (Gr) and concomitant field terms of higher order (E(r)). From this model it can be also shown that if a gradient coil is energized this coil produces changes of $B_z$ also in the two orthogonal directions (FIG. 1).

Figure 2:
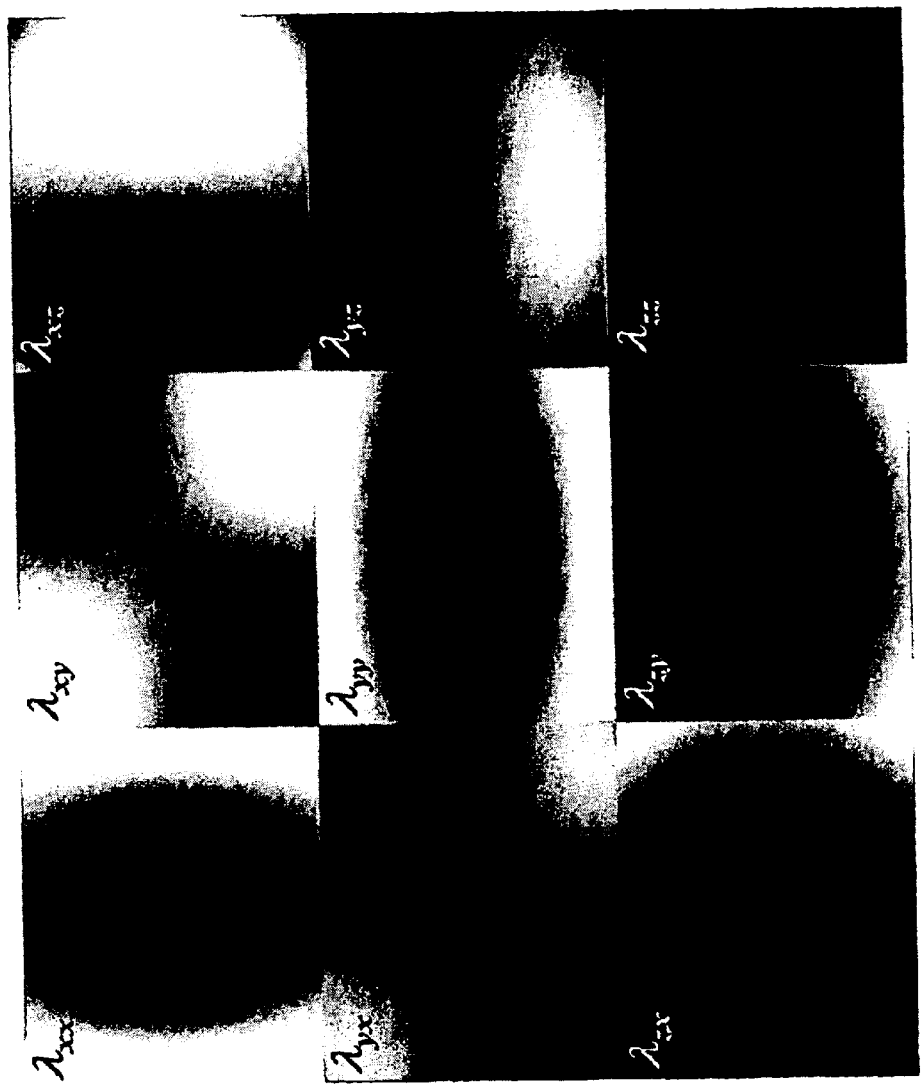
FIG. 2 illustrates perturbation tensor L(r) calculated for each voxel position at z=6 cm.

Using the gradient calibration settings specific for an individual MR unit, the spatial distribution of the individual gradient error functions can be calculated for each slice and used for retrospective correction of image warping and diffusion maps (FIG. 2). In this context, Equation 2 can be evaluated either numerically or analytically. Since in this formulation r=[x y Z]$^T$ is the true location, the geometric distortions in the images have to be unwarped first before the diffusion-encoding correction can be applied. However, the gradient non-linearities causes an RF pulse to excite spins that are not within a flat plane, which is also known as 'potato chipping'. A ubiquitous correction would therefore require determining the displacement of each voxel from the desired slice and to calculate the perturbation tensor at the correct location z' on the 'potato-chipped' slice. This can be done with multi-slice or 3D data. An alternative, not used here but within the scope of this invention, is to define the basis functions in terms of fully warped coordinates. Here we used a spherical expansion model to characterize the spatial field distribution. However, the present invention can be applied to any other method that tries to model the spatial field distribution.

Thus far, correction schemes for both geometric distortions and encoding errors due to gradient non-uniformities in diffusion-weighted imaging and phase-contrast MRI have only considered self-terms of the gradient error function (i.e., $\lambda_{ii}$). However, with the presented generalized correction scheme a considerable improvement in accuracy for flow or diffusion encoded measurements can be achieved.

Providing that the gradient non-uniformity for each of the gradient coils is known at each point within the prescribed scanning slab, the perturbed b-matrix can be expressed as $$b'(r) = \int_0^{TE} k'(r,\tau) k'(r,\tau)^T d\tau = L(r) b L(r)^T \quad (4)$$

with $$k'(r,t) = \gamma \int_{-\infty}^{t} L(r) G(\tau) d\tau = L(r) k(t) \quad (5a)$$

and $$k'(r,t)^T = k(t)^T L(r)^T. \quad (5b)$$

Here, the vector $G(t)=[G_x(t)G_y(t)G_z(t)]T$ is the time-varying, nominal gradient waveform (i.e., free from any spatial non-uniformities) and contains theoretically both imaging and diffusion-encoding gradients. Primed variables denote actual values and unprimed values are used for nominal values.

It is evident that the perturbation in the measured eigensystem depends upon the spatial error terms caused by the gradient non-uniformities. For a DTI acquisition with an arbitrary gradient combination is played out the measured signal is $$M(b',r) = M_0 \exp\left(-\int_0^{TE} k'(r,\tau)^T D(r) k'(r,\tau) d\tau\right) \quad (6)$$

$$= M_0 \exp\left(-\int_0^{TE} k(\tau)^T L(r)^T R(r) \Lambda(r) R(r)^T L(r) k(\tau) d\tau\right)$$

$$= M_0 \exp\left(-\sum_{i=x,y,z}\sum_{j=x,y,z} (b'_{ij}(r) D_{ij})\right)$$

$M_0$ is the MR signal without diffusion-weighting but includes (relaxation, proton density and B1 inhomogeneity). M(b') is the MR signal acquired if a certain diffusion gradient is applied. Those skilled in the art will know that the measurement of M(b') has to be performed with at least six non-collinear gradient combinations to calculate D. Here, D is the nominal diffusion tensor obtained in the gradient frame of reference and can be brought into its intrinsic frame of reference by rotating about the Euler angles using the unitary matrix R ($R^TR=I$):

$$D=R\Lambda R^T. \quad (7)$$

In this context, $\Lambda$ is a diagonal matrix containing the eigenvalues of the tensor and R=[$v_1$, $v_2$, $v_3$] contains the three orthogonal eigenvectors $v_1$, $v_2$, and $V_3$. Therefore, from Equation 6 it can be seen that the eigensystem will be calculated incorrectly if the measured tensor is diagonalized without accounting for the gradient error terms (represented by the spatially dependent L matrix). Providing that the gradient errors are known and L is non-singular, the apparent eigensystem and the real eigensystem are related by $$R(r)=L(r)^{-T}R'(r)U(r)\Sigma(r)^{-1/2} \quad (8a)$$

and $$\Lambda(r)=\Sigma(r)^{1/2}U(r)^T\Lambda'(r)\Sigma(r)^{1/2} \quad (8b)$$

The eigendecomposition of $R'(r)^T L(r)^{-1} L(r)^{-T} R'(r)$ yields $U(r)\Sigma(r)U(r)^T$. To overcome this artifact, one should therefore use the effective b'-matrix (which can be spatially dependent as well) to calculate the correct tensor and the eigensystem.

Coronal and axial diffusion-weighted SE-EPI scans of a homogenous spherical water phantom doped with nickel-chloride (Ø~250 mm, constant sample temperature $\vartheta_{sample}$= 22° C.) were performed on a 1.5T whole-body system (Signa CVi, GE, Milwaukee, Wis.) with a self-shielded, high performance gradient system. The gradient system used was capable of providing a maximum gradient strength of 40 mT/m at a gradient risetime of 268 $\mu s$ for each of the gradient axes. For excitation and signal reception the standard body birdcage resonator was used.

The scan parameters were as follows: TR/TE=8000 ms/71.9 ms, slice thickness/gap=10/0 mm, 41 slices, FOV= 48 cm, matrix=$128^2$, and NEX=3. The EPI sequence used in this study employed partial Fourier imaging and full ramp-sampling at a receiver bandwidth of ±115 kHz. A relatively large FOV was chosen to avoid interference with characteristic FOV/2-ghosts. Diffusion-encoding gradients were played out sequentially along the following directions (desired b=700s/mm$^2$): $[1\ 0\ 0]^T$, $[0\ 1\ 0]^T$, $[0\ 0\ 1]^T$, $[1\ 1\ 0]^T$, $[1\ 0\ 1]^T$, $[0\ 1\ 1]^T$, $[-1\ 1\ 0]^T$, $[-1\ 0\ 1]^T$, and $[0\ -1\ 1]^T$. A scan acquired with the diffusion gradients turned off served as a reference scan. To improve local field homogeneity and, hence, to minimize geometric distortions, a higher order shim was applied for each slice by adjusting resistive shim coils (RMS deviation over the Ø~25 cm sphere: ~5 Hz). The in-plane geometric distortions caused by the gradient non-linearities, were corrected on each diffusion-weighted image using the vendor's standard unwarping software. Ultimately, each image was co-registered to a corresponding FSE reference image in order to also correct for eddy-current induced image warping and other EPI-related distortions. Assuming ideal slice selection (i.e., flat planes), the coregistered images underwent the correction method described in the previous section.

Both the corrected and uncorrected b-matrices were used to calculate the diffusion tensor from the diffusion-weighted measurements in each voxel. Rotationally invariant scalar measures, i.e. the third of the trace of the diffusion tensor (<D>) and the fractional anisotropy (FA), were calculated and served, together with the tensor elements, for comparisons between corrected and uncorrected maps at two representative locations (z=0 cm and z=6 cm).

A quantitative assessment of the efficacy of the gradient nonlinearity correction was performed by analyzing line profiles and characteristic parameters of the statistical distribution of the diffusion coefficients which were measured over the entire object before and after applying the correction. Besides median and maximum values the first three statistical moments were used to characterize the distribution.

To demonstrate the effect of the gradient errors with regard to the deviation from its nominal direction. The absolute angular deviation from its desired direction was calculated $$\alpha_i = \tan^{-1} \frac{\sqrt{\lambda_{ji}^2 + \lambda_{ki}^2}}{\lambda_{ii}}, \quad (9)$$

where i represents the gradient coil (i=x, y, and z) which is energized to produce a magnetic field gradient along the desired direction i, whereas j, k are the corresponding orthogonal directions. The maximum deviation was measured at z=0, 6, and 12 cm for field of views of 15, 25, 40, and 45 cm.

FIG. 2 shows the theoretical spatial dependence of the $\lambda_{ij}$-factors for an axial slice obtained from the spherical harmonics model 6 cm away from the magnet's isocenter. As can be seen in FIG. 1 and FIG. 2 with increasing distance from the isocenter the magnetic field gradient deviates from its nominal magnitude value and orientation. From FIG. 1 it can be also seen that the distortions are less for axial than for sagittal or coronal planes. Notice that the x and y coils have comparable spatial non-uniformity but their effects are transposed.

Figure 3A:
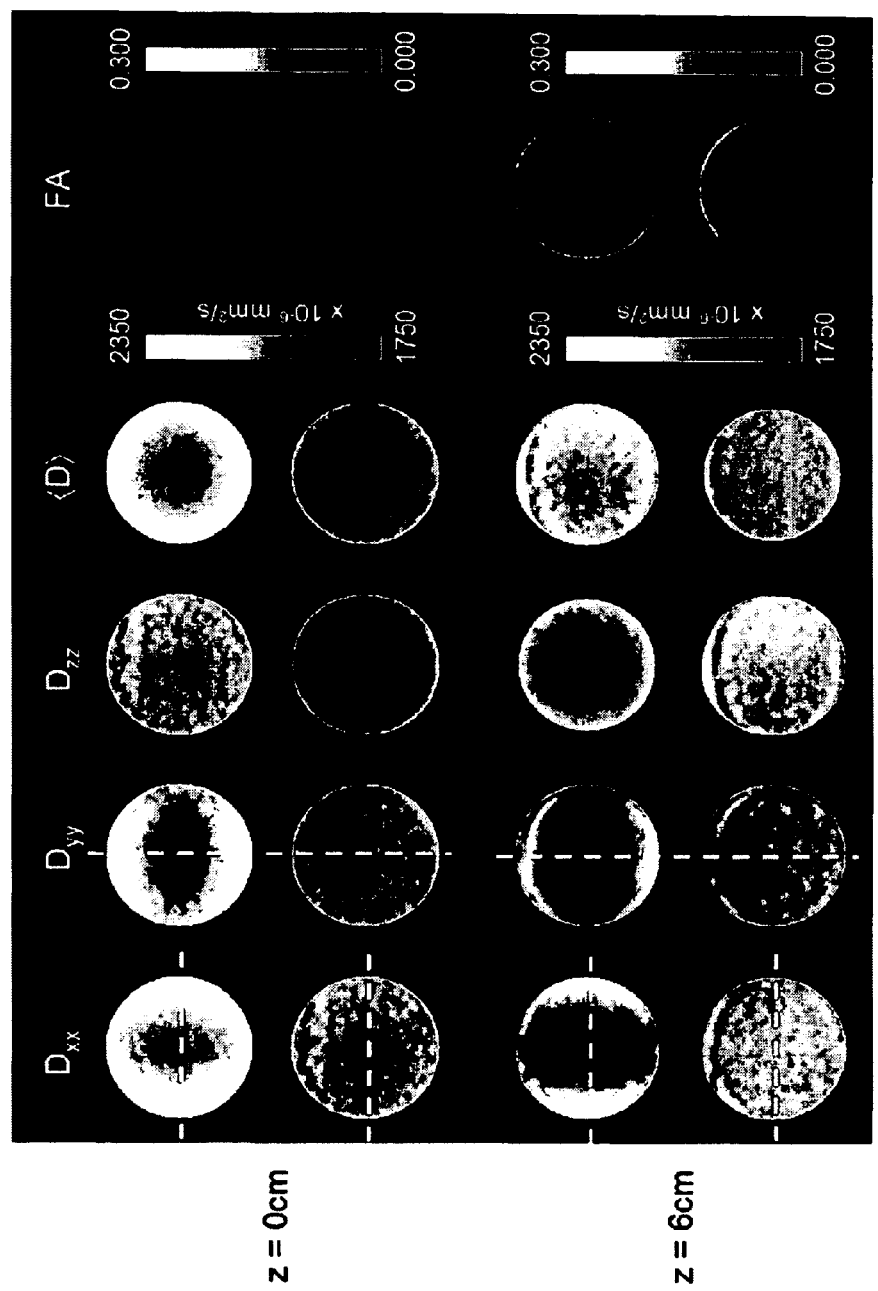
FIG. 3a illustrates calculated diffusion tensor elements ($D_{xx}$, $D_{yy}$, $D_{zz}$), isotropic diffusion coefficient (<D>), and fractional anisotropy (FA) measured in a spherical phantom before and after correction of gradient uniformity.
Figure 3B:
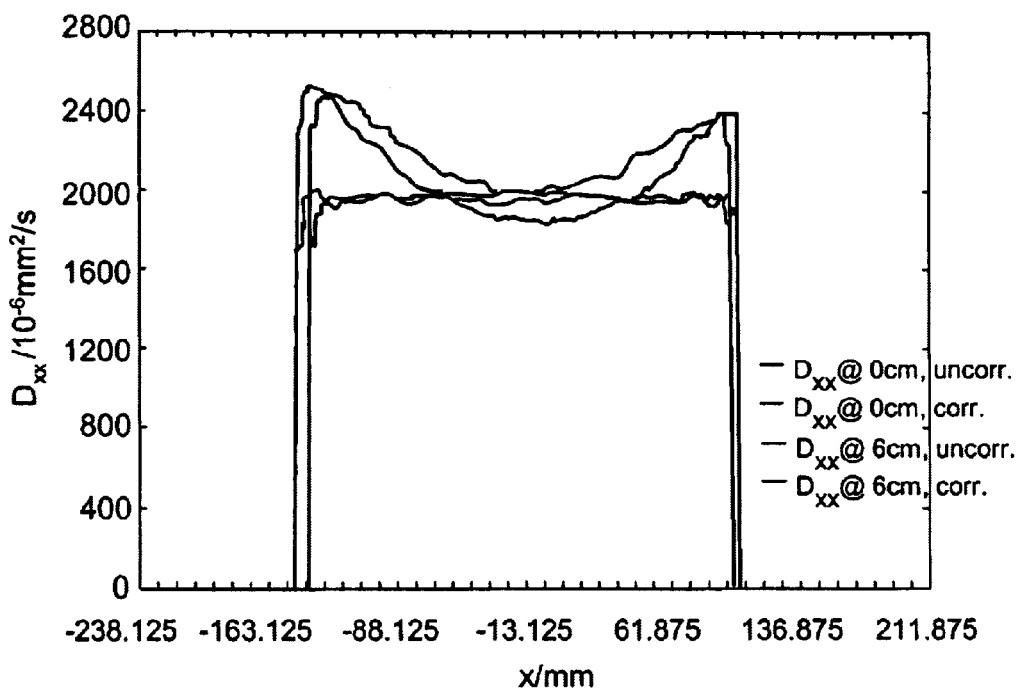
FIGS. 3b and 3c are line profiles through Dxx and Dyy, respectively, parameter map along the dimension with the most significant deviations in diffusivity.
Figure 3C:
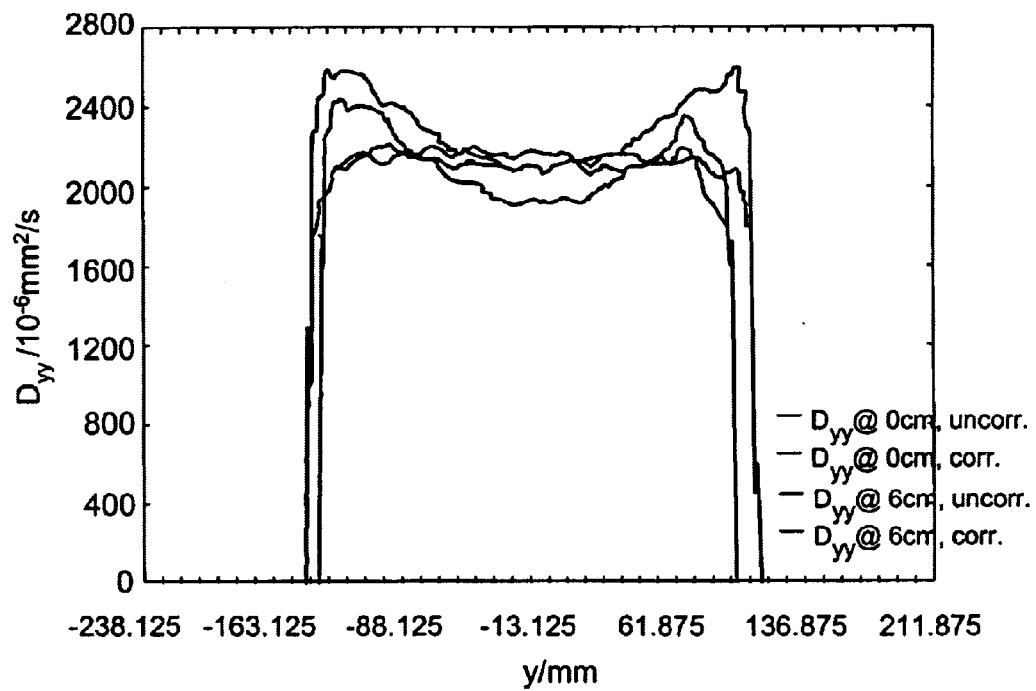

FIG. 3a demonstrates the efficacy of the proposed correction scheme at different distances from the magnet's isocenter along the z-axis (i.e., z=0 cm and z=6 cm) for an isotropic diffusion phantom. FIG. 3a illustrates calculated diffusion tensor elements ($D_{xx}$, $D_{yy}$, $D_{zz}$), isotropic diffusion coefficient <D>, and FA measured in a spherical phantom before (1$^{st}$ and 3$^{rd}$ row) and after (2$^{nd}$ and 4$^{th}$ row) correction of the gradient uniformity. Notice the strong signal fluctuations within the object before the gradient uniformity correction. Despite that fact that an isotropic phantom was used, the distortions in the elements of the diffusion tensor, especially $D_{xx}$ and $D_{yy}$, are clearly evident. While the effects of the diffusion encoding over the field of view are substantial in the original images, they are almost completely eliminated by the proposed correction method. The through-plane component (i.e., the z-component) does not show strong spatial variability over the FOV but does have a constant offset, whereas the in-plane components of the tensor demonstrate strong variation across the field of view. The error in the estimation of the diffusion tensor elements due to gradient non-uniformity can be also be appreciated in the <D> maps but is most striking in the FA maps. FIGS. 3b and c show a side-by-side comparison between corrected and uncorrected values using line profiles through axial slices at z=0 and 6 cm for $D_{xx}$ maps along the x dimension (FIG. 3b) and for $D_{yy}$ maps along they dimension (FIG. 3c) (see dashed lines in FIG. 3a). From these plots one can see that, without correction, at the edges of the phantom the diffusivity is overestimated by more than 20%, whereas centrally the diffusivity can be underestimated by at least 10–15%.

Figure 4A:
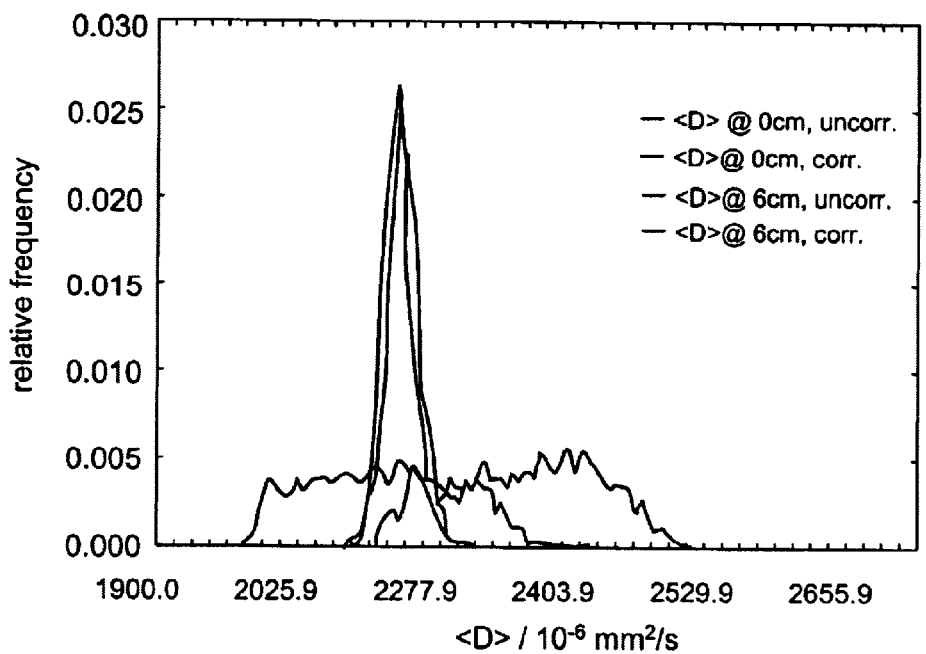
FIGS. 4a and 4b illustrate histograms of isotropic diffusion coefficient and fractional anisotropy FA obtained from tensor measurements of the object of FIG. 3.
Figure 4B:
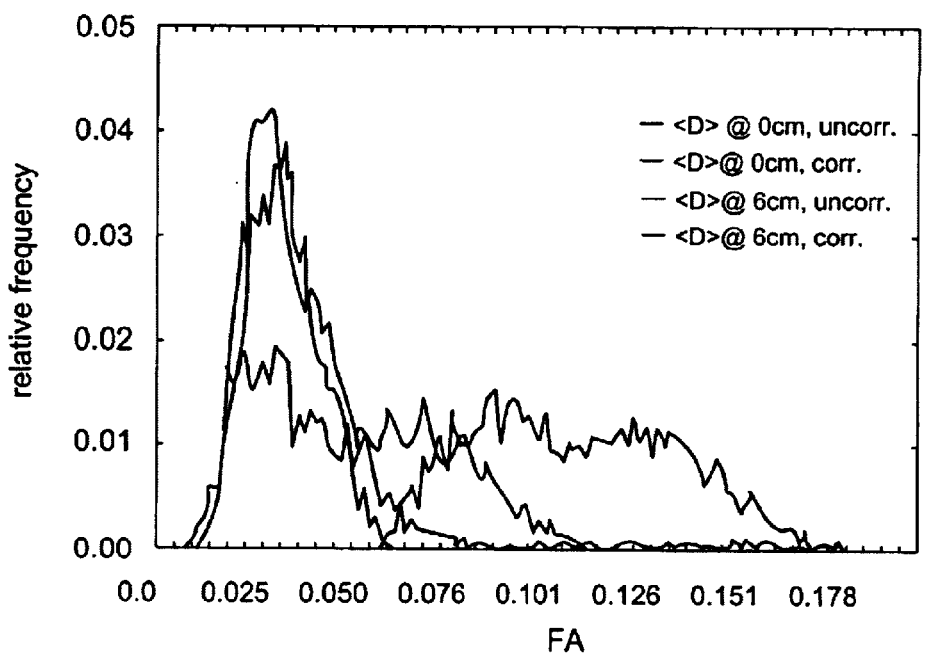

In FIG. 4 the corresponding histograms of (D) and FA obtained from the maps shown in FIG. 3a are plotted before and after the gradient non-uniformity correction. Before correction the histogram from both parameters are spread out over a wide range of values due to the spatially varying diffusion encoding. After the correction, the histograms clearly demonstrate that the variance of the data was reduced. Moreover, after the correction the absolute values corresponded very well to reference values of water for that particular temperature while before the correction the mean values varied strongly. The results obtained from this analysis are summarized in Table 1 below. The residual differences between $D_{xx}$, $D_{yy}$, and $D_{zz}$ (approximately 2%) are most likely due to interactions from diffusion-weighting and imaging gradients (i.e., section select, phaseencode and readout gradients) that have not been accounted for in the b-value calculation but are usually in this range.

TABLE 1

Statistical parameters obtained from histogram measurements

| | | before uniformity correction | | | | after uniformity correction | | | |
|---|---|---|---|---|---|---|---|---|---|
| position | Map | mean† | stddev† | skewness | median† | mean† | stddev† | skewness | median† |
| z = 0 mm | $D_{xx}$ | 2312 | 118 | 0.56 | 2297 | 2156 | 23 | 0.57 | 2154 |
| | $D_{yy}$ | 2264 | 125 | 0.71 | 2238 | 2211 | 27 | 0.46 | 2109 |
| | $D_{zz}$ | 2188 | 32 | 1.04 | 2185 | 2181 | 31 | 1.26 | 2177 |
| | <D> | 2255 | 72 | 0.37 | 2260 | 2149 | 17 | 0.68 | 2148 |
| | 100*FA | 49 | 25 | −0.05 | 46 | 31 | 9 | 0.66 | 29 |
| z = 60 mm | $D_{xx}$ | 2142 | 127 | 0.82 | 2114 | 2210 | 27 | −0.30 | 2212 |
| | $D_{yy}$ | 2084 | 123 | 0.79 | 2057 | 2151 | 42 | −1.85 | 2155 |
| | $D_{zz}$ | 22232 | 65 | 2.19 | 2222 | 2217 | 50 | 2.70 | 2211 |
| | <D> | 2153 | 79 | 0.13 | 2151 | 2193 | 19 | 0.34 | 2192 |
| | 100*FA | 110 | 27 | 0.21 | 108 | 37 | 19 | 3.157 | 32 |

†Values are in units of $10^{-6}$ mm$^2$/s.

Figure 5:
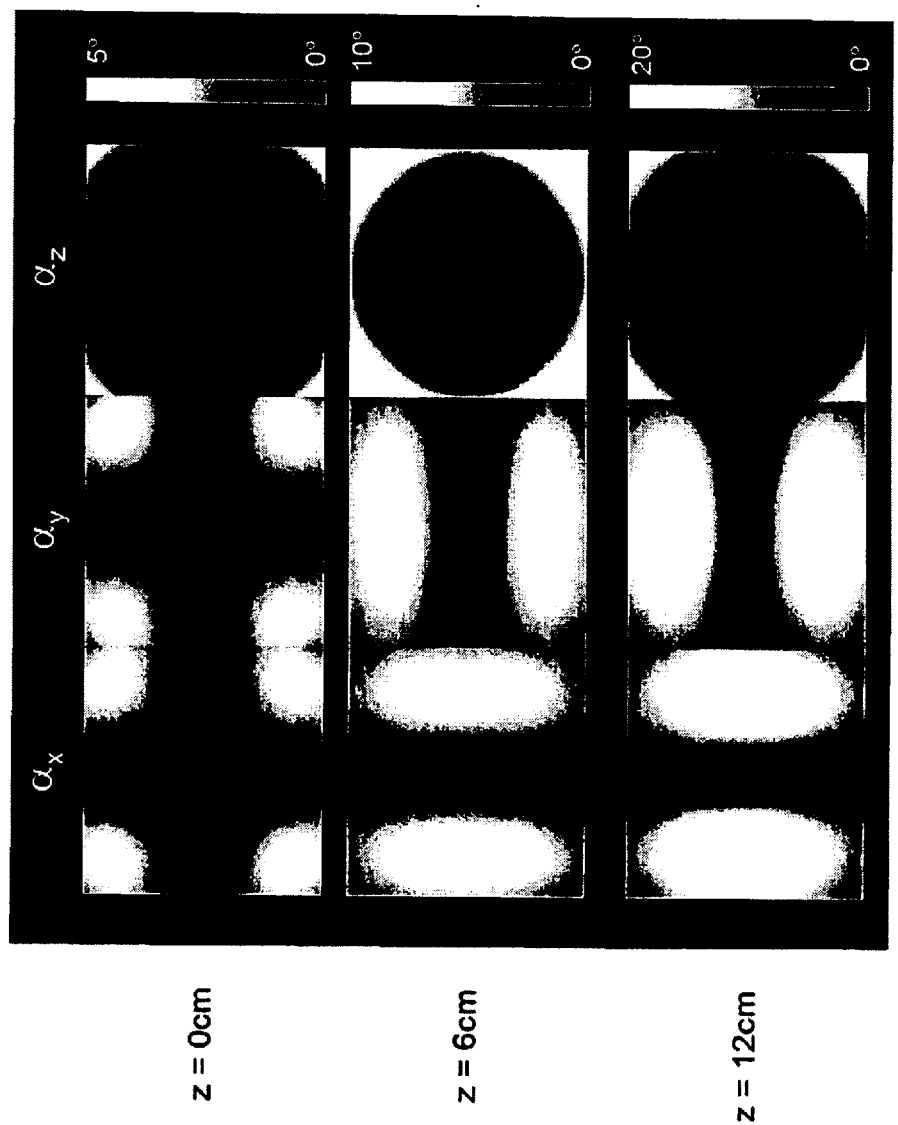
FIG. 5 illustrates absolute deviation from the nominal gradient orientation at different z locations for axial slices with a field of view (FOV) of 25 cm.

For the situation when the gradient errors are neglected for the calculation of the tensor, the deviations from the desired gradient orientation are shown in FIG. 5 for axial slices at z=0 cm (toe row) and z=6 cm (middle row), and z=12 cm (bottom row) for axial slices with a FOV of 25 cm. The $\alpha_x$-maps reflect the angular deviation of the desired from a pure orientation along the x dimension (left column). $\alpha_y$ and $\alpha_z$ show similar deviations along the y and z dimension if the y- or z-coil is energized. The maximum errors in the calculated gradient orientation can reach 9 and 15 degrees for the x- and z-gradient coil, respectively, for an image with a FOV of 25 cm. In larger fields of view these distortions can increase and become even more significant. Therefore, the orientation of a fiber relative to the frame of reference can be encoded entirely wrong. By means of Equation 8 the effect of the gradient non-uniformity on the eigenvectors can be calculated directly. In this context, the maximum deviations from the nominal gradient direction for different FOVs and off-center positions are listed in Table 2.

TABLE 2

Maximum angular deviation from the desired gradient direction caused by gradient nonuniformity

| | $\alpha_{xy,max}$[†] | | | | $\alpha_{z,max}$ | | | |
|---|---|---|---|---|---|---|---|---|
| | 15 cm | 25 cm | 40 cm | 45 cm | 15 cm | 25 cm | 40 cm | 45 cm |
| z = 0 cm | 1.77° | 3.55° | 4.61° | 4.61° | 0.05° | 0.46° | 2.82° | 5.18° |
| z = 6 cm | 6.81° | 9.27° | 9.73° | 9.73° | 0.43° | 2.26° | 15.04° | 24.84° |
| z = 12 cm | 16.63° | 21.41° | 22.00° | 22.00° | 2.60° | 2.61° | 15.83° | 24.92 |

[†]angular deviation for the y-gradient coil are equal to the x-coil but transposed For axial slices with an FOV of 25 cm the deviations of the calculated eigenvectors from the unperturbed orientation can range between approximately ±3 and ±18 degrees for off-center positions ranging from z=0 cm to 18 cm. Again, with larger FOVs or increasing off-center positions these distortions will increase as shown in Tab.3. Of course, for a given diffusion tensor and set of gradient directions, the effect of the gradient non-uniformity on the eigenvectors can be also calculated directly by means of Eq.8.

TABLE 3

Maximum deviations from the nominal eigenvector orientation within FOV[†]

| | deviation from nominal orientation [degrees] | | | |
|---|---|---|---|---|
| slice location | FOV = 15 cm | FOV = 25 cm | FOV = 40 cm | FOV = 45 cm |
| z = 0 cm | ±1.27 | ±3.12 | ±5.95 | ±6.57 |
| z = 6 cm | ±1.73 | ±4.22 | ±8.08 | ±9.04 |
| z = 12 cm | ±3.39 | ±7.89 | ±14.46 | ±16.10 |
| z = 18 cm | ±10.23 | ±17.94 | ±29.85 | ±31.29 |

[†]The tensor with the eigenvalues $2000 \times 10^{-6}$ mm²/s, $400 \times 10^{-6}$ mm²/s, and $400 \times 10^{-6}$ mm²/s was rotated using Euler rotations so that the major eigenvector is along $[1.0, 1.0, 0.0]^T$ and replicated over the whole FOV. Thirty diffusion-encoding directions equally oriented in space were used to simulate tensor acquisition.

Gradient non-uniformities can cause serious artifacts in MRI. For diffusion imaging, these artifacts have to be separated into image distortions and inaccuracies of quantifying diffusion. In this study, simulations and experiments have shown that for fields of view (~25 cm) which are commonly used for routine diffusion studies of the brain, especially for more distant slices the gradient non-linearities induce an overestimation in the diffusion coefficients that can be as large as 25–30% and an underestimation by at least 10–15%. The severity of these effects increases with the distance from the isocenter of the magnet and can be even more dramatic for smaller gradient coils, such as used in head-only MRI systems and modular gradient system (e.g. TWIN design). Without correction, the considerable spatial variation can influence results of studies which, for example, compare small group differences or assess subtle pathological changes over time. Further, due to the possible variable placement of a subject in the magnet from one experiment to another, such an artifact could disguise small pathological effects which are being investigated by the DWI methodology. Moreover, fibertracking can be markedly affected by the altered eigensystem. Overall, the net effect of the gradient errors is twofold. First, the magnitude of the effective diffusion-encoding gradient is no longer constant over the imaging plane and, hence, the diffusion-weighting might vary spatially. Second, the orientation of the diffusion-encoding gradient varies with respect to the spatial position.

As demonstrated in Equations 4 to 8, if the deviations from the desired gradients are not incorporated in the postprocessing, both the eigenvalues and eigenvectors are affected by these gradient errors. The results of the simulations presented in FIG. 5 have shown that the errors in reproducing the orientation of diffusion encoding gradients can vary spatially and reach deviations up to 15 degrees for fields of view routinely used in cranial diffusion tensor imaging studies. This leads also to errors in the determination of the orientation of the tensor eigensystem (i.e. eigenvectors). In other words, the calculated diffusion ellipsoid is scaled and rotated with respect to the true diffusion ellipsoid, whereas for high angular resolution diffusion imaging the diffusion coefficient is gridded into the spherical coordinate space at a wrong position and with wrong magnitude. Note that such deviations can be even more severe in applications where larger FOVs and sagittal or coronal scan orientations are used, such as DWI of the spine or in abdominal diffusion imaging.

With knowledge of the gradient coil design, the deviation from the nominal gradient field can be reliably estimated and corrected using the generalized perturbation tensor approach presented in Equation 1. Especially for the more distant slices it turned out that the use of the full perturbation matrix is much more effective than if only the diagonal elements of this tensors (i.e. self terms) would be used. In this context, however, it is also worthwhile to discuss a few limitations of the presented approach: First, the spherical harmonics expansion model is an approximation of the effective field and, hence, some residual errors can remain. Second, the retrospective correction assumed the error function is uniform over a voxel. This is generally not a problem for the in-plane directions but if there exists a strong variation through the slice, the correction could be incomplete for more remote or thicker slices. Third, dependent on vendor, the algorithm for unwarping the geometric distortions may correct only for in-plane warping while the gradient non-linearities also affect the slice selection process. The effectively selected section has the shape of a "potato chip" than that of a straight two-dimensional plane, while, in its presented form, our correction method assumed flat planes. This second order effect is again more prominent at distant locations than at the isocenter. However, these effects were negligible for slices with an offset smaller than 6 cm from the isocenter, but the correction efficiency was gradually worsening at extreme distances from the isocenter. One can account for curved excitation planes by calculating L(r) for coordinates on such curved planes. More complex implementations will be clear to one skilled in the art and are within the scope of the present invention.

Off-resonances cause geometric distortions along the phase encoding direction in single-shot EPI. This can lead to a mismatch between the acquired diffusion images and the underlying gradient error model (FIG. 3). However, both higher order shimming and registration to an undisturbed template helped to minimize image distortions in the phantom measurements. Fortunately, the gradient error function is relatively smooth and the residual image distortions are small and, therefore, do not cause too severe problems. But to some extent, the residual misalignment explains the slightly weaker performance at the more distant slice that has been analyzed in this study. Theoretically, a more accurate and distortionless measurement technique would be beneficial for a systematic analysis of the impact of gradient non-uniformities on diffusion-weighted imaging. However, with regard to robustness against motion single-shot EPI is still the method of choice. Potential alternatives, such as diffusion-weighted gradient-echo imaging, FSE, or line scan diffusion imaging were not used for this study because of the lack of availability for correction of geometric distortions induced by gradient nonlinearities or simply because of lacking robustness against bulk motion. Nonetheless, these imaging methods can also benefit from the present invention.

The effects of gradient non-uniformities on diffusion encoding are clearly evident in measurements in phantoms with isotropic diffusion properties and—as shown in this study—equally apply to diffusion tensor measurements. An experimental verification of these effects in highly anisotropic objects is however extremely difficult because of the lack of appropriate diffusion anisotropy phantoms and the fact, that for in-vivo experiments, the spatially varying fiber architecture makes the effect of the gradient non-uniformity difficult to appreciate.

Gradient non-uniformities in high-performance scanners can be considerable and can cause serious inaccuracies in quantification of (anisotropic) diffusion and fiber tracking. Generally, these non-uniformities have to be separated into distortions and inaccurate quantification of physical properties. By using a spherical harmonic expansion of the effective magnetic field one can calculate a perturbation tensor which reflects the deviations from the nominal field and, thus, correct for incorrect diffusion encoding in a straightforward fashion.

While the invention has been described with reference to specific embodiments, the description is illustrative of the invention and is not to be construed as limiting the invention. Various modifications and applications may occur to those skilled in the art without departing from the true scope and spirit of the invention as defined by the appended claims.

APPENDIX

An arbitrary tensor D can be brought into its eigensystem using the *Schur* decomposition $$D = R \Lambda R^T . \tag{A1}$$

Similarly, a system $$D' = \Phi^T D \Phi , \tag{A2}$$

where $\det \Phi \neq 0$, can be also decomposed into its, though different, eigensystem $$D' = R' \Lambda' R'^T \tag{A3}$$

Hence, solving Equation A2 for D and substituting Equation A3 yields $$D = R \Lambda R^T = \Phi^{-T} D' \Phi^{-1} = \Phi^{-T} R' \Lambda' R'^T \Phi^{-1} , \tag{A4}$$

where $R \neq \Phi^{-T} R'$ and $\Lambda \neq \Lambda'$ because $\left(\Phi^{-T} R'\right)^T \Phi^{-T} R' = R'^T \Phi^{-1} \Phi^{-T} R' \neq I$ .~~is not unitary~~. However, there exists a K such that $$D = \left(\Phi^{-T} R' K^{-1}\right)\left(K \Lambda' K^{-1}\right)\left(K^{-T} R'^T \Phi^{-1}\right), \tag{A5}$$

where $$\Phi^{-T} R' K^{-1} = R \tag{A6a}$$

and $$K \Lambda' K^T = \Lambda . \tag{A6b}$$

Since $R^T R = I$, we must also have $$R^T R = K^{-T} R'^T \Phi^{-1} \Phi^{-T} R' K^{-1} = K^{-T} R'^T \Psi R' K^{-1} = I . \tag{A7}$$

Performing the eigendecomposition of the symmetric matrix $R'^T \Psi R' = U\left(\Sigma^{1/2} \Sigma^{1/2}\right) U^T$ yields to an expression for K:

$$K = \Sigma^{1/2} U^T , \tag{A8}$$

where $U^{-1} = U^T$ and $U^{-T} = U$. Hence, Equation A7 becomes $$\left(\Sigma^{-1/2} U^{-1}\right)\left(U \Sigma U^T\right)\left(U^{-T} \Sigma^{-1/2}\right) = I \quad \text{(A9)}$$

Finally, one eigensystem can be transformed into the other (via A6 and A8) by applying the following operations on the eigenvector matrix and the diagonalized cartesian tensor:

$$R = \Phi^{-T} R' U^{-T} \Sigma^{-1/2} = \Phi^{-T} R' U \Sigma^{-1/2} \quad \text{(A10a)}$$

$$\Lambda = \Sigma^{1/2} U^T \Lambda' U \Sigma^{1/2}. \quad \text{(A10b)}$$

What is claimed is:

1. In diffusion tensor imaging (DTI) using magnetic resonance, a method of correcting for the effects of non-uniformities of magnetic field gradients on quantative diffusion imaging comprising the step of:
   a) performing diffusion weighted scans of a body in the presence of magnetic field gradients, to obtain diffusion weighted magnetic resonance images/spectra,
   b) identifying non-linearities in the gradients using a gradient model to approximate actual gradient fields,
   c) identifying magnetic resonance images/spectra distortions due to the effects caused by gradient non-linearities identified in step b), and
   d) correcting encoding errors in the diffusion weighted magnetic resonance images/spectra using the identified distortions.

2. The method as defined by claim 1 wherein the model in step a) s is a spherical harmonics expansion.

3. The method as defined by claim 2 wherein step c) includes using an unwarping program to correct in-plane geometric distortions caused by gradient non-linearities on each diffusion weighted magnetic resonance images/spectra.

4. The method as defined by claim 2 wherein in step b) the spatial dependence of a field gradient is expressed as the following spatial harmonic expansion:

$$B_z^{i=x,y,z}(r) = \sum_{k=0}^{\infty} \sum_{l=0}^{k} \alpha_{kl}^i H_{kl}^C(r) + \beta_{kl}^i H_{kl}^S(r) = Gr + E(r),$$

where $H_{kl}^C(r)$ and $H_{kl}^S(r)$ are the solid spherical harmonic basis functions, $\alpha_{kl}^i$ and $\beta_{kl}^i$ are the corresponding coefficients that are specific to a MRI system being used, Gr is desired linear gradient field component and $E(r)$ is undesired field deviation.

5. The method as defined by claim 2 wherein $$G_{act}(r) = \begin{pmatrix} \lambda_{xx}(r) & \lambda_{xy}(r) & \lambda_{xz}(r) \\ \lambda_{yx}(r) & \lambda_{yy}(r) & \lambda_{yz}(r) \\ \lambda_{zx}(r) & \lambda_{xy}(r) & \lambda_{zz}(r) \end{pmatrix} G = L(r) G$$

where L is the ratio of the actual gradient, $G_{act}$, to the desired gradient, G, and $\lambda$ are relative gradient spatial error coefficients.

* * * * *